(12) United States Patent
Usami et al.

(10) Patent No.: US 7,282,726 B2
(45) Date of Patent: Oct. 16, 2007

(54) APPARATUS AND METHOD FOR IRRADIATING ELECTRON BEAM

(75) Inventors: Mamoru Usami, Tokyo (JP); Kazushi Tanaka, Tokyo (JP); Yukio Kaneko, Tokyo (JP); Naoyuki Echigo, Tokyo (JP); Akihiko Kizaki, Tokyo (JP); Hiroshi Tominaga, Tokyo (JP); Kunihiko Ozaki, Tokyo (JP)

(73) Assignee: TDK Corporation, Tokyo (JP)

( * ) Notice: Subject to any disclaimer, the term of this patent is extended or adjusted under 35 U.S.C. 154(b) by 460 days.

(21) Appl. No.: 11/029,815

(22) Filed: Jan. 4, 2005

(65) Prior Publication Data
US 2005/0180877 A1 Aug. 18, 2005

(30) Foreign Application Priority Data
Jan. 7, 2004 (JP) ............................. 2004-002233

(51) Int. Cl.
*A61I 2/00* (2006.01)
(52) U.S. Cl. ............................. 250/492.3; 250/492.1; 250/492.22; 250/453.11; 250/454.11; 250/455.11; 422/22
(58) Field of Classification Search ............ None
See application file for complete search history.

(56) References Cited
U.S. PATENT DOCUMENTS
5,414,267 A 5/1995 Wakaopulos

FOREIGN PATENT DOCUMENTS
JP 2-208325 A 8/1990
JP 7-019340 A 1/1995
JP 9-101400 A 4/1997

OTHER PUBLICATIONS
Related U.S. Appl. No. 11/029,810, filed Jan. 4, 2005; Inventor: Mamoru Usami et al.; Entitled: Apparatus and Method for Irradiating Electron Beam.

*Primary Examiner*—Jack I. Berman
*Assistant Examiner*—Zia R. Hashmi
(74) *Attorney, Agent, or Firm*—Frishauf, Holtz, Goodman & Chick, P.C.

(57) ABSTRACT

An electron beam irradiation apparatus includes a turn-transfer mechanism; a turn-transfer chamber; an electron beam irradiation section; a replacement room configured to bring a target into and out of the turn-transfer chamber; an outer irradiation target holding table configured to form a part of the replacement room, and including an X-ray shielding mechanism, an airtightness maintaining mechanism, and a target holding mechanism; an inner irradiation target holding table, configured to form a part of the replacement room, and including an X-ray shielding mechanism, an airtightness maintaining mechanism, and a target holding mechanism, the inner irradiation target holding table being supported by the turn-transfer mechanism; a turning mechanism configured to turn the turn-transfer mechanism and an elevator mechanism configured to move the turn-transfer mechanism up and down; and a rotation mechanism disposed at the electron beam irradiation section and configured to rotate the target.

27 Claims, 9 Drawing Sheets

APPARATUS AND METHOD FOR IRRADIATING ELECTRON BEAM

BACKGROUND OF THE INVENTION

1. Field of the Invention

The present invention relates to an electron beam irradiation apparatus and irradiation method for performing electron beam irradiation so as to carry out a process, such as cross-linking or curing of a coating formed of, e.g., a printing ink, paint, an adhesive, a pressure sensitive adhesive, or a hard protective film, which is formed on a target object, such as a display unit, optical disk, glass lens, or ID card; or a process, such as sterilization or modification of an object.

2. Description of the Related Art

Many techniques using electron beam irradiation have been proposed as means for carrying out a process, such as cross-linking, curing, or modification of a coating formed of, e.g., a paint, an adhesive, a pressure sensitive adhesive, or a hard protective film, which is disposed on a substrate (for example, Jpn. Pat. Appln. KOKAI Publication No. 2-208325). When a process using electron beam irradiation takes place, electrons are accelerated by an acceleration voltage within a vacuum, and an irradiation target placed within a vacuum or inert gas atmosphere is irradiated with the accelerated electrons.

Processing techniques using electron beam irradiation have many advantages, such that an irradiation target is far less heated, no organic solvent needs to be used, and no curing initiator is necessary.

However, the technique disclosed in the publication described above needs an electron beam irradiation tube of a drum type, and problems thereby arise, as follows. Specifically, such a large electron irradiation tube is operated at a high acceleration voltage, which requires a strict X-ray shield. Further, a large amount of inert gas, such as nitrogen gas, needs to be supplied, so that the oxygen ratio in the atmosphere around an irradiation target is reduced to prevent inhibition of curing by oxygen. As a consequence, the conventional electron beam irradiation apparatus becomes very large in its own size with a large weight. In addition, an electron beam at a high acceleration voltage may cause deterioration, such as yellowing, of some substrates.

As a technique for preventing an increase in the size of the entire apparatus, Jpn. Pat. Appln. KOKAI Publication No. 9-101400 discloses an arrangement in which a transfer system for an irradiation target is modified. In this arrangement, however, since an apparatus having a load-lock chamber is further enveloped within a shield chamber made of lead, the entire apparatus inevitably ends up being still large.

Jpn. Pat. Appln. KOKAI Publication No. 7-019340 discloses a vacuum chamber for ion beam irradiation arranged for the purpose of decreasing the size and contamination, which can actually realize a compact vacuum chamber. This technique, however, is not directed to electron beam irradiation, and thus includes nothing about an X-ray shield. Accordingly, this technique does not solve the problems described above in relation to electron beam irradiation apparatuses, to which the present invention is directed.

U.S. Pat. No. 5,414,267 discloses a technique for downsizing an electron beam irradiation tube and decreasing the acceleration voltage, in which the material of an electron beam irradiation window is modified to realize a high transmittancy for an electron beam even at a low acceleration voltage. Since this technique can thus downsize an electron beam irradiation tube and decrease the acceleration voltage, the amount of X-rays generated from the electron beam irradiation tube is smaller, which allows use of stainless steel in place of lead as an X-ray shield material. Further, since the acceleration voltage to draw out an electron beam is low, a substrate is less affected.

However, since this technique still needs to use an X-ray shield, an inert gas, and a vacuum, the entire apparatus inevitably ends up being large. Further, this publication only discloses a complicated and large apparatus structure including a transfer mechanism prepared for an irradiation target, such as a sheet or cable. Accordingly, as regards an apparatus for performing electron beam irradiation on a number of single articles, this publication does not suggest anything about downsizing or simplifying such an apparatus, or reducing the cycle time for processing an irradiation target.

BRIEF SUMMARY OF THE INVENTION

An object of the present invention is to provide an electron beam irradiation apparatus, which is compact and simple, uses a smaller amount of inert gas, and has a shorter cycle time for processing an irradiation target.

Another object of the present invention is to provide an electron beam irradiation method, which uses such an electron beam irradiation apparatus to realize electron beam irradiation with a shorter cycle time for processing an irradiation target.

According to a first aspect of the present invention, there is provided with an electron beam irradiation apparatus comprising: a turn-transfer mechanism configured to transfer an irradiation target; a turn-transfer chamber in which the turn-transfer mechanism is disposed; an electron beam irradiation section disposed at a part of the turn-transfer chamber, and configured to irradiate the irradiation target with an electron beam while the irradiation target is rotated; a replacement room disposed at a part of the turn-transfer chamber, and configured to bring the irradiation target into and out of the turn-transfer chamber; an outer irradiation target holding table disposed outside the turn-transfer chamber, configured to form a part of the replacement room, and including an X-ray shielding mechanism, an airtightness maintaining mechanism, and an irradiation target holding mechanism; an inner irradiation target holding table disposed inside the turn-transfer chamber, configured to form a part of the replacement room, and including an X-ray shielding mechanism, an airtightness maintaining mechanism, and an irradiation target holding mechanism, the inner irradiation target holding table being supported by the turn-transfer mechanism; a turning mechanism configured to turn the turn-transfer mechanism and an elevator mechanism configured to move the turn-transfer mechanism up and down; and a rotation mechanism disposed at the electron beam irradiation section and configured to rotate the irradiation target.

According to a second aspect of the present invention, there is provided with an electron beam irradiation method for irradiating an irradiation target with an electron beam under an inert gas atmosphere while rotating the irradiation target, using an electron beam irradiation apparatus, which comprises a turn-transfer mechanism configured to transfer an irradiation target; a turn-transfer chamber in which the turn-transfer mechanism is disposed; an electron beam irradiation section disposed at a part of the turn-transfer chamber, and configured to irradiate the irradiation target with an electron beam while the irradiation target is rotated; a replacement room disposed at a part of the turn-transfer chamber, and configured to bring the irradiation target into and out of the turn-transfer chamber; an outer irradiation target holding table disposed outside the turn-transfer chamber, configured to form a part of the replacement room, and including an X-ray shielding mechanism, an airtightness maintaining mechanism, and an irradiation target holding mechanism; an inner irradiation target holding table disposed inside the turn-transfer chamber, configured to form a part of the replacement room, and including an X-ray shielding mechanism, an airtightness maintaining mechanism, and an irradiation target holding mechanism, the inner irradiation target holding table being supported by the turn-transfer mechanism; and a rotation mechanism disposed at the electron beam irradiation section and configured to rotate the irradiation target, the method comprising: transferring the irradiation target into and out of the turn-transfer chamber in a replacement room formed by the inner irradiation target holding table and the outer irradiation target holding table, which respectively form parts of the replacement room; turn-transferring the inner irradiation target holding table, which supports the irradiation target, to the electron beam irradiation section, within the turn-transfer chamber; and irradiating the irradiation target with an electron beam while rotating the irradiation target by the rotation mechanism, within the inner irradiation target holding table.

According to the present invention, when an irradiation target is brought into and out of the electron beam irradiation section of the turn irradiation chamber, the outer irradiation target holding table and the inner irradiation target holding table form the replacement room working as a load-lock door. This load-lock door realizes an X-ray shield function and an airtightness maintaining function for the turn irradiation chamber. Further, the tables also work as transfer tables within the turn irradiation chamber. As a consequence, the electron beam irradiation apparatus can be structured to be simple and lightweight, and the entire apparatus becomes compact. Further, the amount of consumption of inert gas can be reduced, for filling the turn irradiation chamber to prevent curing inhibition by oxygen on an irradiation target. This can shorten the time necessary for displacement with an inert gas, and thus can realize a cycle time shortened by that much.

Electron beam irradiation on an irradiation target is performed in parallel with replacement of irradiation targets. This can also shorten the cycle time of the electron beam irradiation process.

Further, since the amount of consumption of inert gas, such as nitrogen gas, is remarkably reduced, the running cost of the electron beam irradiation apparatus can be lower, thereby reducing the process cost of irradiation targets.

Furthermore, the outer irradiation target holding table, which is used for transferring an irradiation target to and from the inner irradiation target holding table, includes a load-lock mechanism and an X-ray shielding mechanism, which enhance the advantages described above of the present invention.

In addition, where the electron beam irradiation section is formed of vacuum-tube type irradiation tubes, which are used at an acceleration voltage of 80 kV or less, the apparatus can be more compact. In this case, since the acceleration voltage is low, the X-ray shield does not necessary have to be made of lead, which is toxic, and an irradiation target substrate is less damaged or deteriorated.

Further, where the apparatus is provided with a rotation mechanism for rotating an irradiation target, or a shutter mask, the absorption dose can be more uniform. In this case, the number of vacuum-tube type irradiation tubes can be reduced, thereby reducing the cost of the electron beam irradiation apparatus, and the running cost in relation to the operating life of the irradiation tubes.

DETAILED DESCRIPTION OF THE INVENTION

A detailed description will be given of embodiments of the present invention, with reference to drawings.

Figure 1:
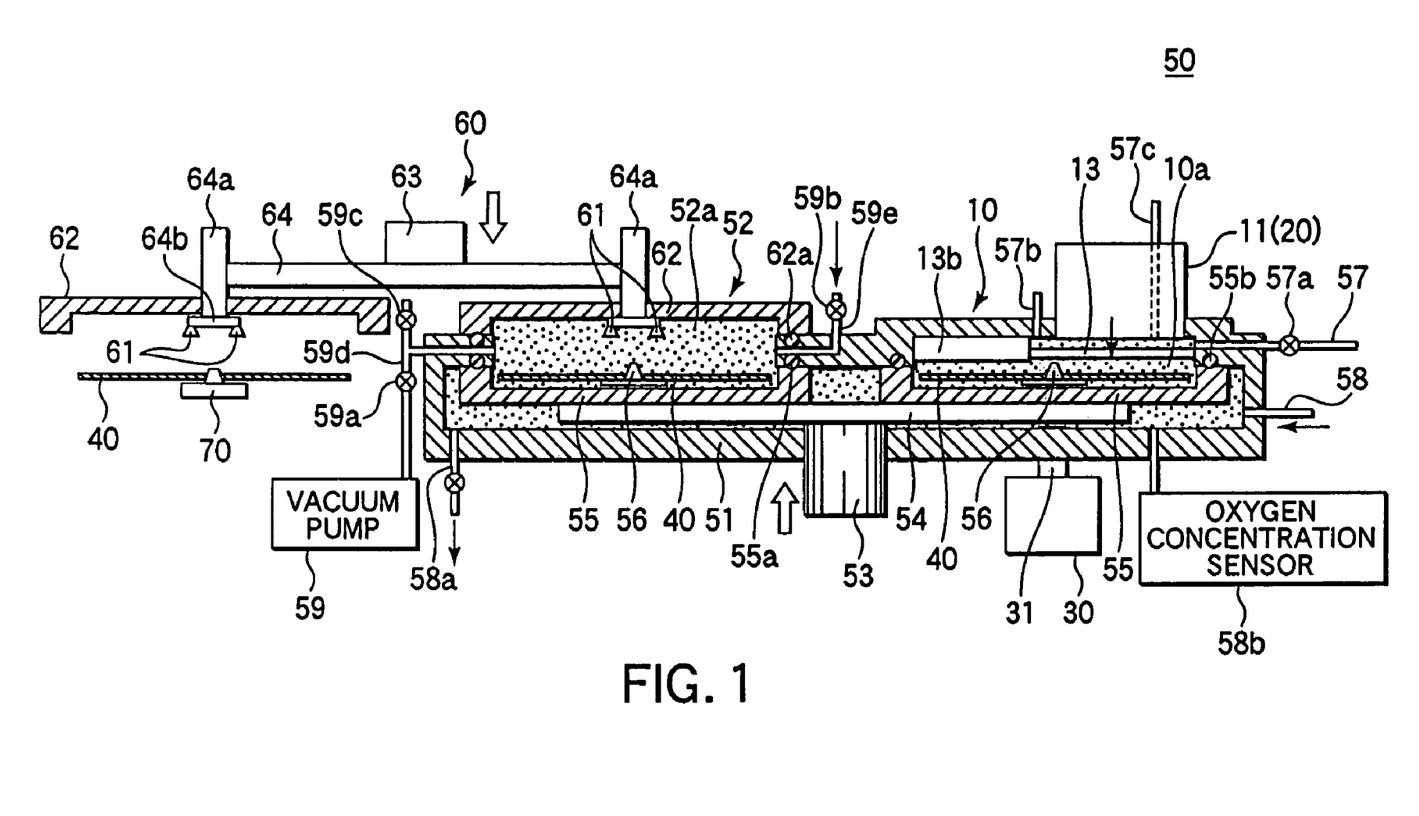
FIG. 1 is a sectional view showing a schematic structure of an electron beam irradiation apparatus according to an embodiment of the present invention.
Figure 2:
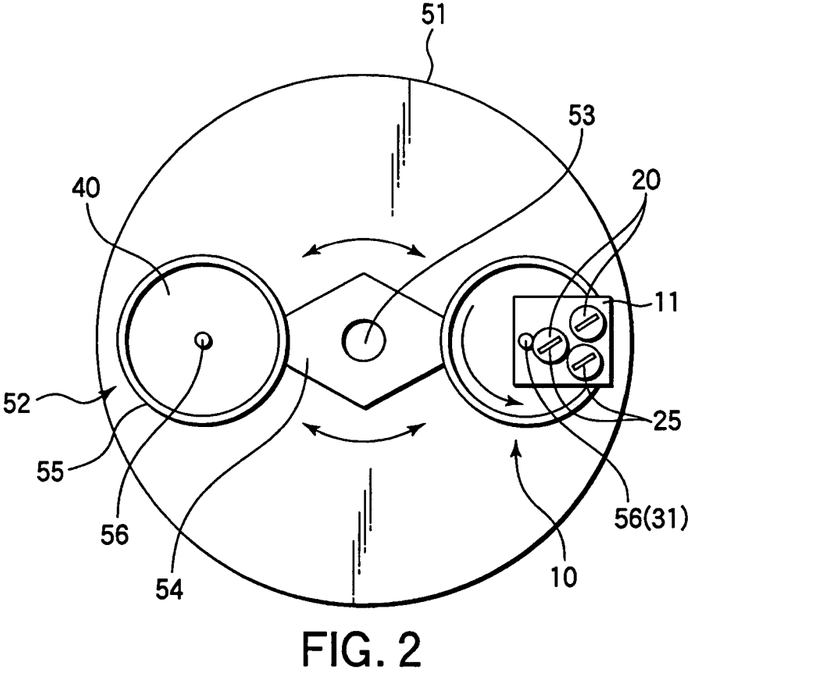
FIG. 2 is a plan view showing a schematic structure of the electron beam irradiation apparatus according to an embodiment of the present invention.

FIG. 1 is a sectional view schematically showing an electron beam irradiation apparatus according to an embodiment of the present invention, and FIG. 2 is a plan view thereof.

This electron beam irradiation apparatus 50 includes a chamber 51, which is provided with an electron beam irradiation section 10 and a replacement room section 52 disposed at its ceiling. The chamber 51 accommodates a plurality of inner transfer turn trays 55 each for supporting an irradiation target 40, and a revolution arm portion 54 supporting these inner transfer turn trays 55. Each of the inner transfer turn trays 55 has a recess opened upward, with an irradiation target support 56 provided at the center for detachably supporting the irradiation target 40. As illustrated in FIG. 2, this embodiment has two inner transfer turn trays 55 disposed at intervals to divide the entire circumference equally into two portions.

Alternatively, three inner transfer turn trays 55 may be disposed at intervals to divide the entire circumference of the revolution track made by the revolution arm portion 54 equally into three portions.

The irradiation target 40 is a plate-like object having a surface covered with a resin layer formed of, e.g., a print ink, a paint, an adhesive, or a protective film material, which has been applied by, e.g., a spin coating, coating, or spraying method.

The chamber 51 is provided with a revolution shaft 53 at the center to turn (revolve) the inner transfer turn trays 55 each supporting an irradiation target 40 within the chamber 51, by the revolution arm portion 54, such that the trays 55 pass through the electron beam irradiation section 10 and replacement room section 52.

This revolution shaft 53 is movable up and down by an elevator mechanism (not shown), so that the inner transfer turn trays 55 supported by the revolution arm portion 54 can be moved up and down within the chamber 51.

The wall surface of the chamber 51 is provided with an inert gas inlet 58, a gas outlet 58a, and an oxygen concentration sensor 58b. An inert gas, such as nitrogen gas is supplied therethrough to set the oxygen concentration within the chamber 51 measured by the oxygen concentration sensor 58b to be equal to or less than a predetermined value.

The replacement room section 52 of the chamber 51 has an opening 52a provided with a shielding seal portion 55a, at a position corresponding to the periphery of each inner transfer turn tray 55. In order to bring one of the inner transfer turn trays 55 into close contact with the opening 52a, the inner transfer turn trays 55 are turned by the revolution shaft 53 to position this tray directly below the opening 52a, and they are then moved up. At this time, the close contact portion of the opening 52a with the inner transfer turn tray 55 becomes airtight at a high level, thereby realizing an excellent shielding characteristic against X-rays generated as described later.

An irradiation target transfer device 60 and an irradiation target delivery portion 70 are disposed outside the chamber 51. This irradiation target transfer device 60 includes an outer transfer arm 64, a plurality of outer transfer turn trays 62 connected to the opposite ends of the outer transfer arm 64 each through a holding arm 64a, and an outer transfer turn shaft 63 for turning the outer transfer arm 64 and moving it up and down. The outer transfer arm 64 has a span connecting the replacement room section 52 and the irradiation target delivery portion 70 to each other. The holding arms 64a are disposed at the opposite ends of the outer transfer arm 64 perpendicularly to the arm 64. The outer transfer turn trays 62 are respectively attached to the bottom ends of the holding arms 64a. Each of the outer transfer turn trays 62 has a recess opened downward, and is supported to be movable up and down relative to the corresponding holding arm 64a.

Although not specifically shown, the portion of each outer transfer turn tray 62 where the holding arm 64a penetrates is also provided with a shielding seal structure, so that this portion is kept airtight and provided with an X-ray shield.

It should be noted that the term "turn" used for an irradiation target in this specification means that it is turned while shifting stop positions, such that it is turned by a predetermined amount in one direction or the opposite direction, and is then stopped there. Although the irradiation target is moved about a certain point used as the center, this differs from rotation in which the target is continuously rotated in one direction (or the opposite direction).

The bottom end of each holding arm 64a, which penetrates the center of the outer transfer turn tray 62, is provided with a flange 64b for preventing the outer transfer turn tray 62 from becoming dislodged, and holding portions 61 for detachably holding an irradiation target 40. This arrangement is used to perform a replacement operation of the irradiation target 40 while holding it, between the irradiation target delivery portion 70 and the inner transfer turn tray 55 disposed in the replacement room section 52. Each holding portion 61 is formed of, e.g., a mechanical chuck or vacuum chuck.

A shielding seal portion 62a is disposed at the periphery of the opening 52a of the replacement room section 52, so that, when each outer transfer turn tray 62 is brought into close contact with the opening 52a by the outer transfer arm 64 moved up and down, this portion is kept airtight and provided with an X-ray shield.

Specifically, the replacement room section 52 is formed and functions as a load-lock chamber, when the inner transfer turn tray 55 disposed inside the chamber 51 and the outer transfer turn tray 62 disposed outside the chamber 51 engage to airtightly close the opening 52a. This arrangement allows an irradiation target 40 to be transferred in and out, while preventing X-ray leakage, without damaging the inert gas atmosphere within the chamber 51.

The opening 52a of the replacement room section 52 is provided with a vacuum exhaust line 59d connected to a vacuum pump 59, for exhausting the interior of the replacement room section 52. The opening 52a is also provided with a displacement gas supply line 59e connected to an inert gas supply source (not shown), for supplying an inert gas, such as nitrogen gas, into the replacement room section 52.

The vacuum exhaust line 59d divided into a branch line connected to the vacuum pump 59, and a branch line opened to atmosphere, which are provided with an exhaust control valve 59a and an atmosphere ventilation valve 59c, respectively. The displacement gas supply line 59e is provided with a displacement gas supply control valve 59b, to control supply of an inert gas into the replacement room section 52.

The chamber 51, inner transfer turn trays 55, and outer transfer turn trays 62, described above, are made of a metal material with a thickness necessary for blocking X-rays, which are generated during electron beam irradiation, as described later. Each of the shielding seal portion 55a and shielding seal portion 62a, which are respectively disposed at the portions of the chamber 51 to be in close contact with the inner transfer turn trays 55 and outer transfer turn trays 62, is provided with a step portion (not shown) to prevent X-rays from directly leaking even if there is a small gap, i.e., to allow only reflected X-rays to leak outside. Accordingly, X-ray shielding mechanisms are respectively constituted by the metal material with a thickness necessary for blocking X-rays and the step portion of the shielding seal portion 55a, and the metal material and the step portion of the shielding seal portion 62a. Specifically, in general, it is safe if the shielding seal portion 55a and shielding seal portion 62a have a shape to reflect, two times or more, X-rays emitted from an X-ray generation source, because the leakage X-ray quantity is remarkably reduced to a safe X-ray level present under ordinary living conditions.

Figure 3:
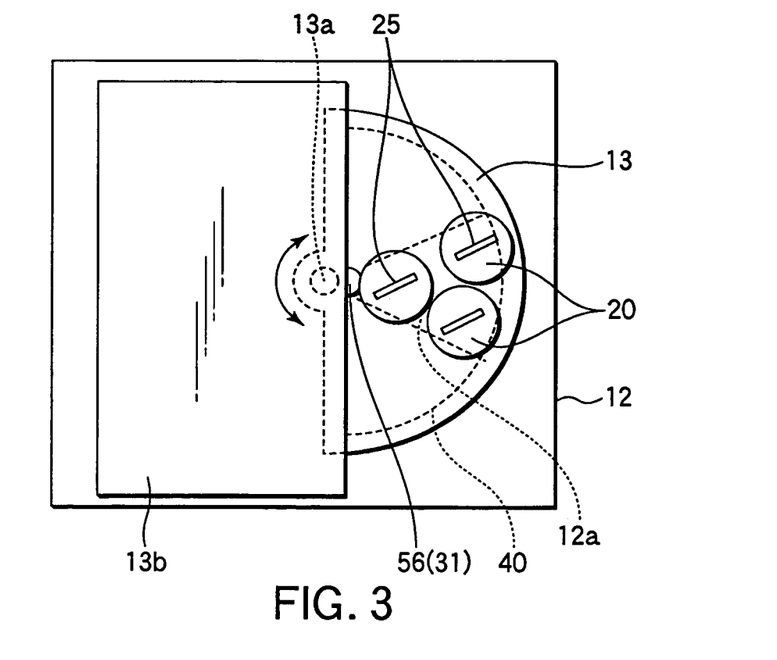
FIG. 3 is an enlarged plan view showing the electron beam irradiation section of the electron beam irradiation apparatus according to an embodiment of the present invention.

On the other hand, as shown in FIG. 2 and in FIG. 3 showing an enlarged view thereof, the electron beam irradiation section 10 according to this embodiment includes a shield box 11 for blocking X-rays, which is airtightly connected to the chamber 51; electron beam irradiation sources contained in the shield box 11 and formed of a plurality of vacuum-tube type irradiation tubes 20; a shutter 13 for controlling electron beam irradiation by the vacuum-tube type irradiation tubes 20 to be performed or not on an irradiation target 40; a shutter swivel shaft 13a that supports the shutter 13 to be turnable; a shutter swing mechanism 13b for swinging the shutter 13 about the shutter swivel shaft 13a; and a shielding seal portion 55b with which each of the inner transfer turn trays 55 comes into close contact to form an electron beam irradiation room 10a. The shielding seal portion 55b is provided with a step portion (not shown) to prevent X-rays from directly leaking even if there is a small gap, i.e., to allow only reflected X-rays to leak outside, as in the shielding seal portion 55a. Accordingly, an X-ray shielding mechanism is constituted by the metal material with a thickness necessary for blocking X-rays and the step portion of the shielding seal portion 55b.

According to this embodiment, as shown in FIG. 2, the electron beam irradiation section 10 and the replacement room section 52 are disposed at positions symmetric with respect to the revolution shaft 53. Accordingly, electron beam irradiation on an irradiation target 40 is performed while the inner transfer turn trays 55 are stopped and replacement of another irradiation target 40 at the replacement room section 52 is performed.

Specifically, a rotation drive shaft 31 driven by a rotation drive mechanism 30 is disposed at a position opposite to the electron beam irradiation section 10 with the chamber 51 interposed therebetween. The rotation drive shaft 31 is movable up and down through the chamber 51, revolution arm portion 54, and inner transfer turn tray 55. When the revolution arm portion 54 is turn-transferred, the shaft 31 is set at a lower position at the bottom of the chamber 51 where it does not interfere with the revolution arm portion 54. When the revolution arm portion 54 is stopped for replacement of irradiation targets 40, the shaft 31 is moved up to engage with the bottom of the irradiation target support 56, so as to lift an irradiation target 40 from the inner transfer turn tray 55 to a predetermined height, and rotate it.

According to this embodiment, as shown in FIGS. 2 and 3, the vacuum-tube type irradiation tubes 20 and the opening 12a of a mask 12 are disposed in a radial direction at a position shifted from the center of an irradiation target 40 rotated at the electron beam irradiation section 10.

The shutter 13 is essentially semi-circular, and is swung about the shutter swivel shaft 13a to control electron beam irradiation to be performed or not on an irradiation target 40. For this control, the shutter 13 is swung between a shield position (for closing the opening 12a of the mask 12) where it blocks electron beams radiated from the vacuum-tube type irradiation tubes 20 toward the irradiation target 40, and an open position shifted by 180 degrees from the shield position.

The mount portion of the chamber 51 for the shield box 11 is connected to an inert gas feed line 57 and an inert gas exhaust line 57b, for circulating a cooling inert gas through the bottom ends of the vacuum-tube type irradiation tubes 20. The inert gas feed line 57 is provided with an inert gas feed control valve 57a for controlling the flow rate of the inert gas supplied for cooling. An apparatus control section (not shown) controls the supply, stop, and flow rate of the inert gas in accordance with the temperature detected by a temperature sensor 57c at the bottom of the vacuum-tube type irradiation tubes 20, so that the vacuum-tube type irradiation tubes 20 are effectively cooled by a minimum amount of inert gas thus required.

Figure 4:
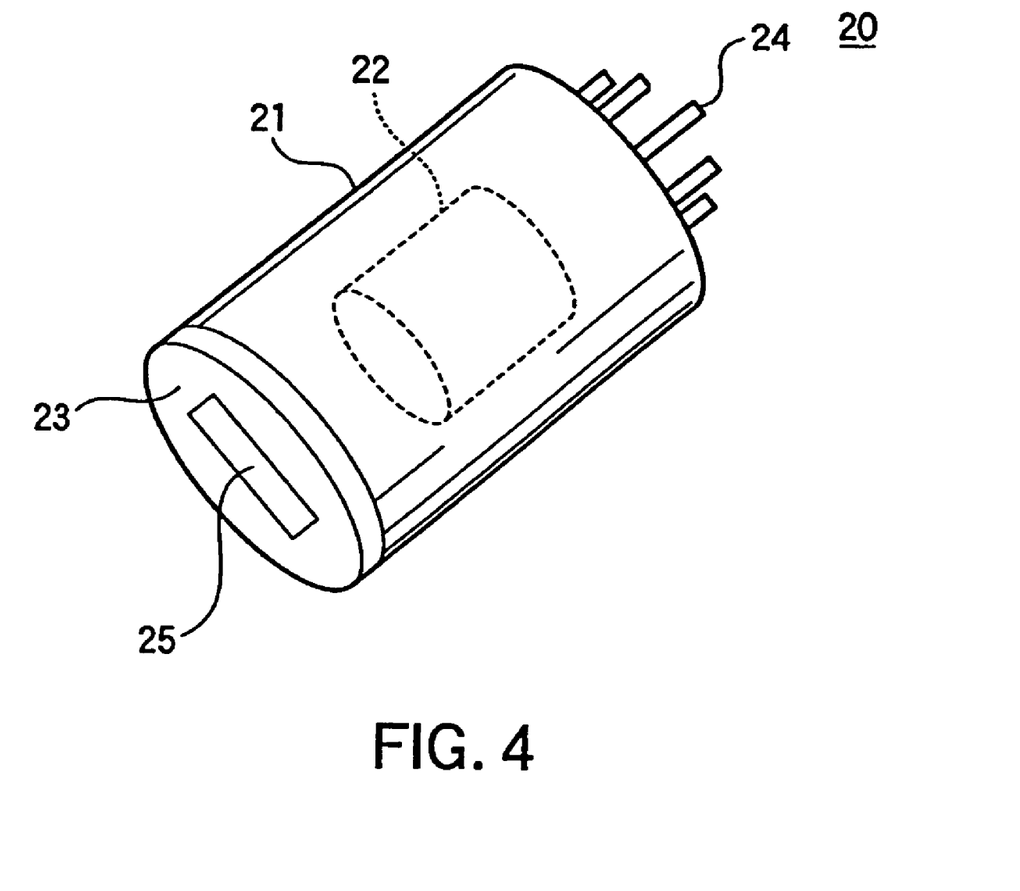
FIG. 4 is a perspective view showing an electron beam irradiation tube used in the electron beam irradiation apparatus according to an embodiment of the present invention.

Each of the electron beam irradiation sources disposed in the electron beam irradiation section 10 is preferably of a vacuum-tube type, as disclosed in U.S. Pat. No. 5,414,267 described above. Such a vacuum-tube type electron beam irradiation source employs an electron beam generating portion formed of a vacuum-tube type irradiation tube 20, as shown in FIG. 4. The vacuum-tube type irradiation tube 20 includes a cylindrical vacuum tube 21 made of glass or ceramic; an electron beam generating portion 22 disposed in the vacuum tube 21 serving to draw out electrons emitted from a cathode and accelerate the electrons so as to generate an electron beam; an electron beam emitting portion 23 disposed at an end of the vacuum tube 21 to emit the electron beam; and an electricity supply pin portion 24 to which electricity is supplied from a power supply (not shown). The electron beam emitting portion 23 is provided with a thin film radiation window 25. The radiation window 25 of the electron beam emitting portion 23 has a shape like a slit and does not allow any gas to pass therethrough, but allows the electron beam to pass therethrough.

The vacuum-tube type irradiation tubes 20 are arrayed at the bottom opening of the shield box 11, while their electron beam emitting portions 23 are directed downward, so that they irradiate an irradiation target with electron beams emitted through the radiation windows 25, when the target passes through the electron beam irradiation section 10.

Figure 5:
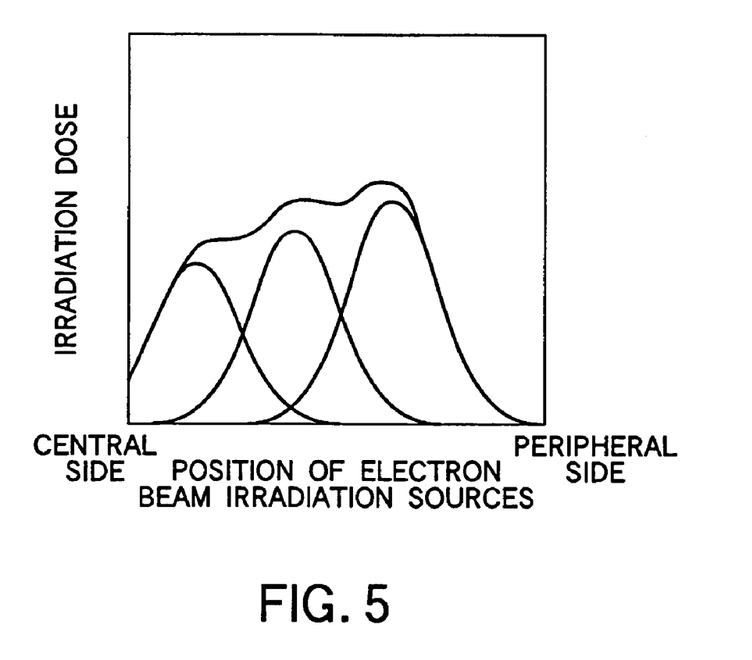
FIG. 5 is a view showing a modification of the irradiation dose distribution of a plurality of vacuum-type irradiation tubes used in the electron beam irradiation apparatus according to an embodiment of the present invention.

According to this embodiment, an irradiation target 40 is irradiated with electron beams emitted from the vacuum-tube type irradiation tubes 20 arrayed in a radial direction, while the irradiation target 40 is rotated. In this case, the central and peripheral sides of the irradiation target 40 have different peripheral velocities in passage. Accordingly, if the irradiation is simply performed at a uniform radiation dosage in the radial direction, the dose amount (irradiation dose) becomes excessive at the central side and insufficient at the peripheral side. For this reason, as illustrated in FIG. 5, the irradiation dose distribution of the vacuum-tube type irradiation tubes 20 arrayed in the radial direction of the irradiation target 40 is controlled, such that the irradiation dose is gradually higher as their positions are shifted from the central side to the peripheral side of the irradiation target 40. With this arrangement, the irradiation target 40 can be irradiated with electron beams uniformly all over, when the irradiation target 40 is rotated.

An electron beam irradiation source, such as the vacuum-tube type irradiation tube 20 described above, is fundamentally different from conventional drum type electron beam irradiation sources. Conventional drum type electron beam irradiation sources are of the type in which electron beam irradiation is performed while the interior of a drum is kept vacuum-exhausted. Conventional drum type electron beam generation sources are large-sized, and are difficult for use in a transfer line, as described above, and also difficult to adjust in terms of the electron current, acceleration voltage, and distance, as described above. On the other hand, the electron beam generation source including the vacuum-tube type irradiation tube 20 described above is compact, and is easy for use in an inline manner. Further, an electron beam is effectively drawn out at a lower acceleration voltage, with good controllability, so the adjustment described above can be easily performed. In addition, the underlying layer below a target layer for electron beam irradiation is less affected. Since the acceleration voltage is low, radiation rays, such as X-rays, are less generated, whereby the shielding devices for blocking the radiation rays can be compact or reduced. Furthermore, according to this vacuum-tube type electron beam irradiation source, the vacuum-tube type irradiation tubes 20 can be controlled independently of each other, thereby facilitating their inclination, gradient, or adjustment, as described later.

In general, electron beam irradiation is performed under an inert gas atmosphere of, e.g., nitrogen gas. On the other hand, according to this vacuum-tube type electron beam irradiation source, irradiation may be performed under air or an atmosphere containing an inert gas, which is close to air, depending on the conditions.

Next, an explanation will be given of an operation of the electron beam irradiation apparatus according to this embodiment with the arrangement described above.

As described later, the electron beam irradiation apparatus according to this embodiment continuously repeats replacement and electron beam irradiation for irradiation targets 40. However, an explanation will start from the state shown in FIG. 1, for the sake of convenience.

The interior of the chamber 51 is filled with an inert gas, which flows in from the inert gas inlet 58 and flows out from gas outlet 58a. The oxygen concentration therein detected by the oxygen concentration sensor 58b is controlled to be equal to or less than a predetermined value.

As shown in FIG. 1, from the irradiation target transfer device 60, the outer periphery of one of the outer transfer turn trays 62 comes into close contact with the outer periphery of the opening 52a through the shielding seal portion 62a. On the other hand, from the chamber 51, one of the inner transfer turn trays 55 is positioned relative to the opening 52a of the replacement room section 52 by turning of the revolution shaft 53 and is moved up. By doing so, the inner transfer turn tray 55, which supports an irradiation target 40 having already been subjected to irradiation, comes into close contact with the opening 52a through the shielding seal portion 55a. As a consequence, the replacement room section 52 is formed in an airtightly closed state.

At this time, the other inner transfer turn tray 55, which supports an irradiation target 40 having not yet been subjected to irradiation, is positioned at the electron beam irradiation section 10, simultaneously with that at the replacement room section 52. This inner transfer turn tray 55 comes into close contact with the shielding seal portion 55b, thereby forming the electron beam irradiation room 10a. At this time, the shutter 13 is closed, as shown in FIG. 3, to block electron beams from the vacuum-tube type irradiation tubes 20 disposed within the shield box 11.

Figure 6:
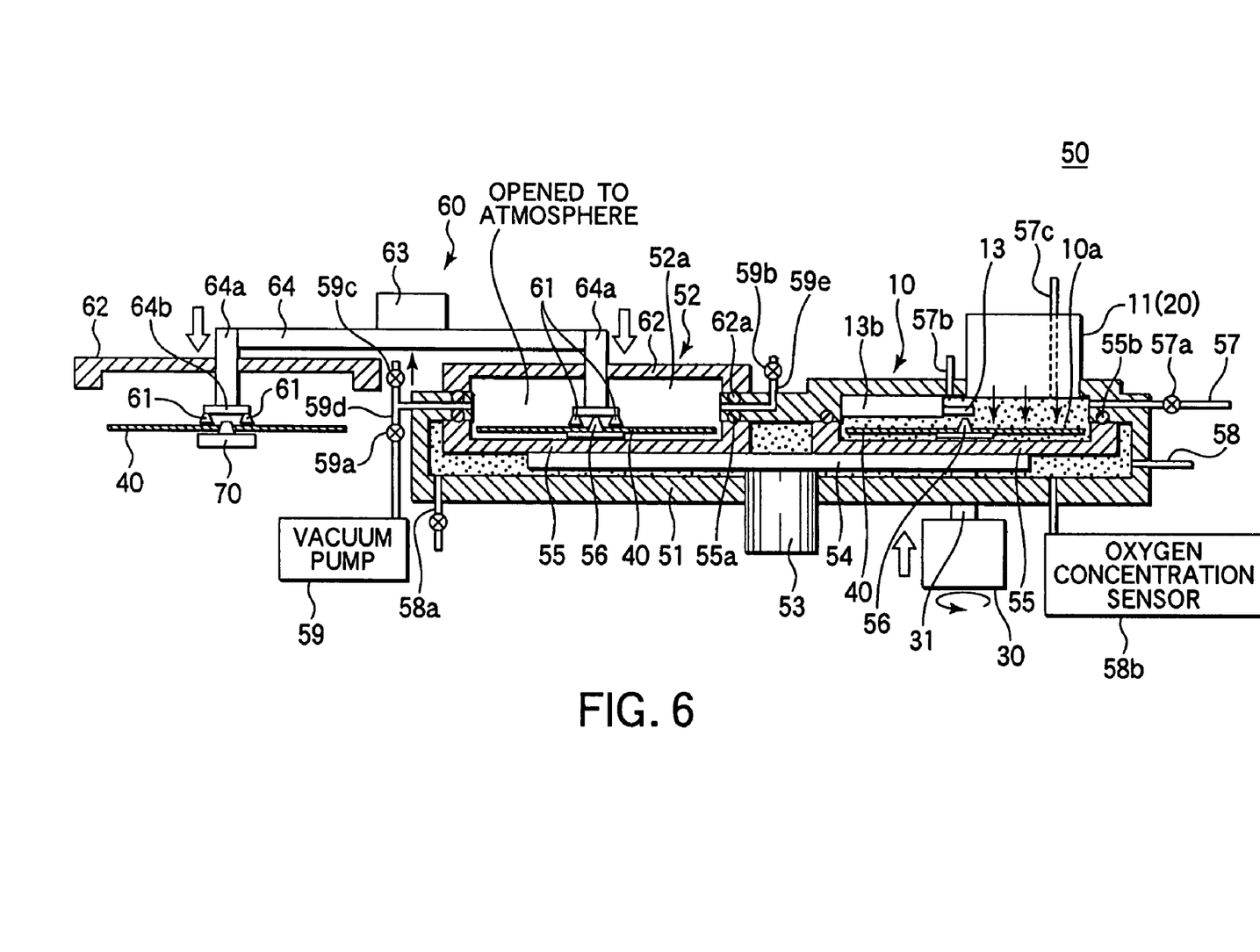
FIGS. 6 to 9 are sectional views each showing a schematic structure of the electron beam irradiation apparatus according to an embodiment of the present invention, for explaining an operation thereof.

Then, as shown in FIG. 6, after the atmosphere ventilation valve 59c is opened to connect the replacement room section 52 to atmosphere, the holding arms 64a provided on the outer transfer arm 64 of the irradiation target transfer device 60 are moved down, and the irradiation target 40 placed within the replacement room section 52 is held by vacuum-chucking of the holding portions 61 of one of the holding arms 64a. At the same time, an irradiation target 40, which has not yet been subjected to irradiation and is placed on the irradiation target delivery portion 70 outside the chamber 51, is held by vacuum-chucking of the holding portions 61 of the other of the holding arms 64a.

In parallel with the replacement operation being started at the replacement room section 52, the rotation drive shaft 31 at the electron beam irradiation section 10 is moved up and is connected to the irradiation target support 56, which supports an irradiation target 40, to lift the irradiation target support 56 to a predetermined height. Then, the irradiation target 40 is rotated by the rotation drive mechanism 30, and the shutter 13 is opened to start electron beam irradiation by the vacuum-tube type irradiation tubes 20.

Figure 7:
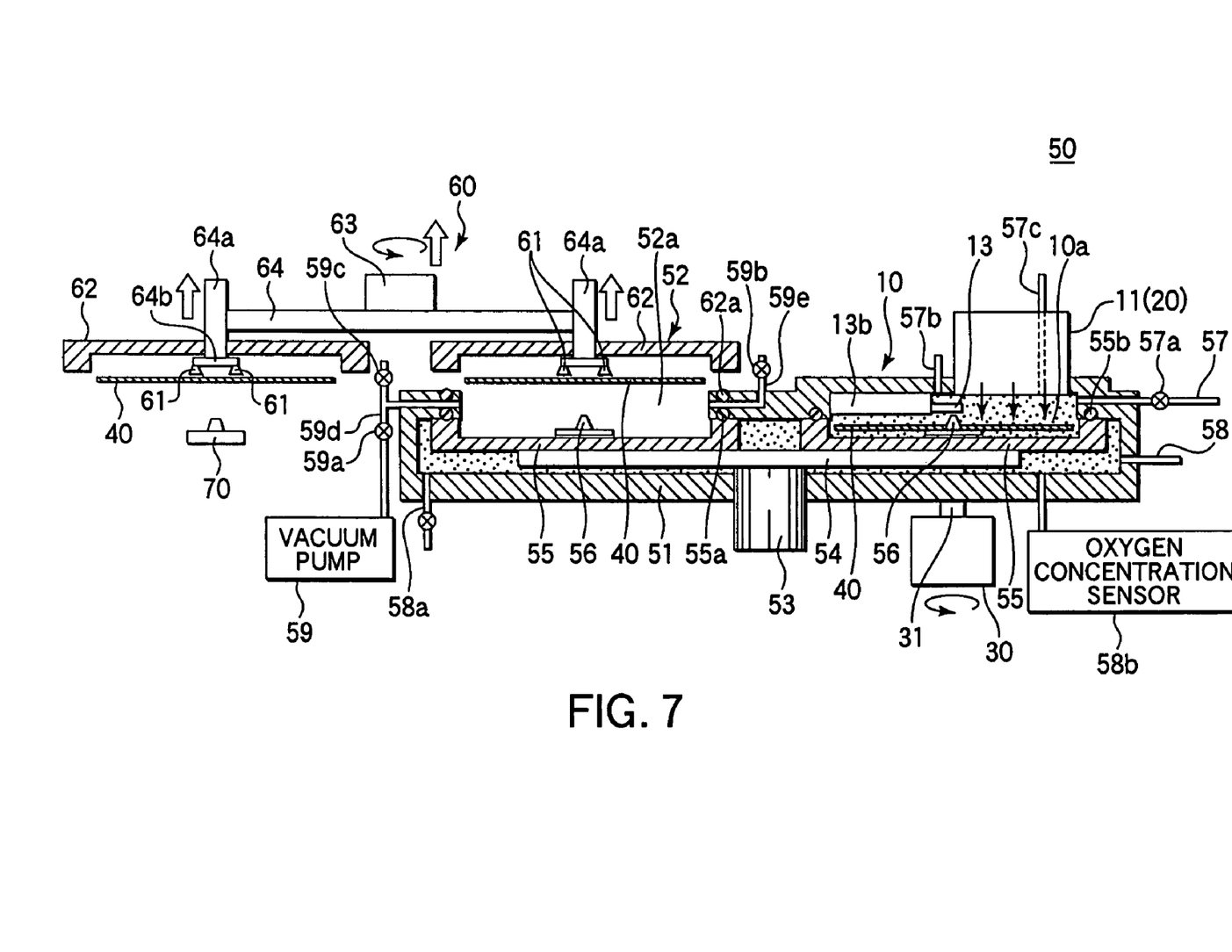
Figure 8:
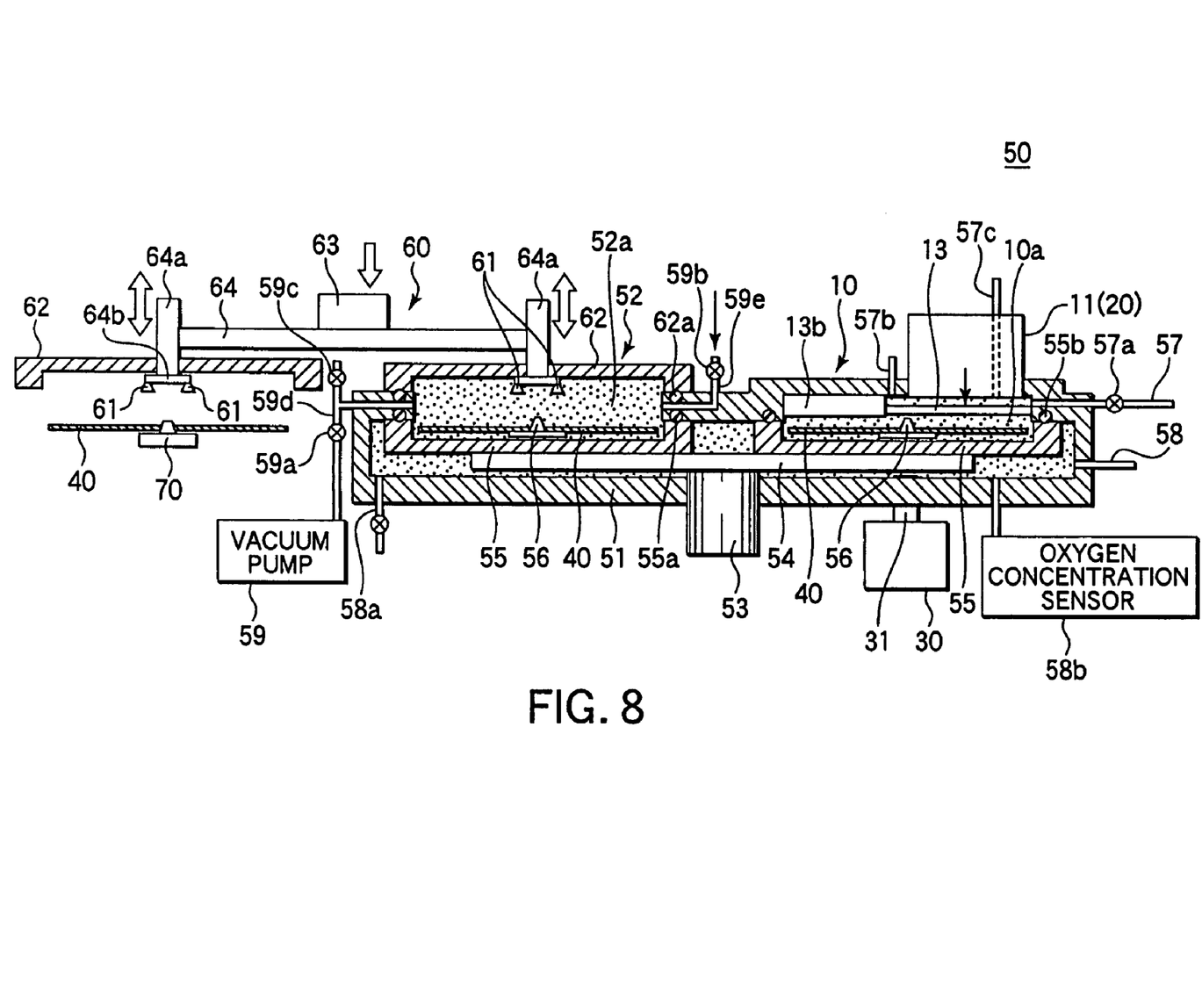

Thereafter, as shown in FIG. 7, the holding arms 64a are moved up, then the entire outer transfer arm 64 are further moved up, and the outer transfer turn shaft 63 is turned by 180 degrees, so that the positions of the irradiated irradiation target 40 and the non-irradiated irradiation target 40 are switched to each other. Then, as shown in FIG. 8, the outer transfer turn trays 62 supported by the outer transfer arm 64 are moved down, so that the non-irradiated irradiation target 40 is delivered to the inner transfer turn tray 55, and the irradiated irradiation target 40 is delivered to the irradiation target delivery portion 70. Also, the replacement room section 52 is formed in an airtightly closed state by the inner transfer turn tray 55 and outer transfer turn tray 62.

Then, while the displacement gas supply control valve 59b and atmosphere ventilation valve 59c are closed, the exhaust control valve 59a is opened, and the interior of the replacement room section 52 is vacuum-exhausted by the vacuum pump 59. Then, the exhaust control valve 59a is closed and the displacement gas supply control valve 59b is opened, an inert gas is supplied for a short period of time into the replacement room section 52 in a vacuum-exhausted state. By doing so, the interior of the replacement room section 52 is entirely displaced with a relatively small amount of inert gas in a short period of time.

During the replacement operation described above at the replacement room section 52, electron beam irradiation is performed at the electron beam irradiation section 10 for a predetermined period of time. Then, as shown in FIG. 8, the shutter 13 is closed to stop electron beam irradiation, and rotation by the rotation drive shaft 31 is also stopped. The rotation drive shaft 31 is moved down to retreat to a position where it does not interfere with the revolution arm portion 54.

Figure 9:
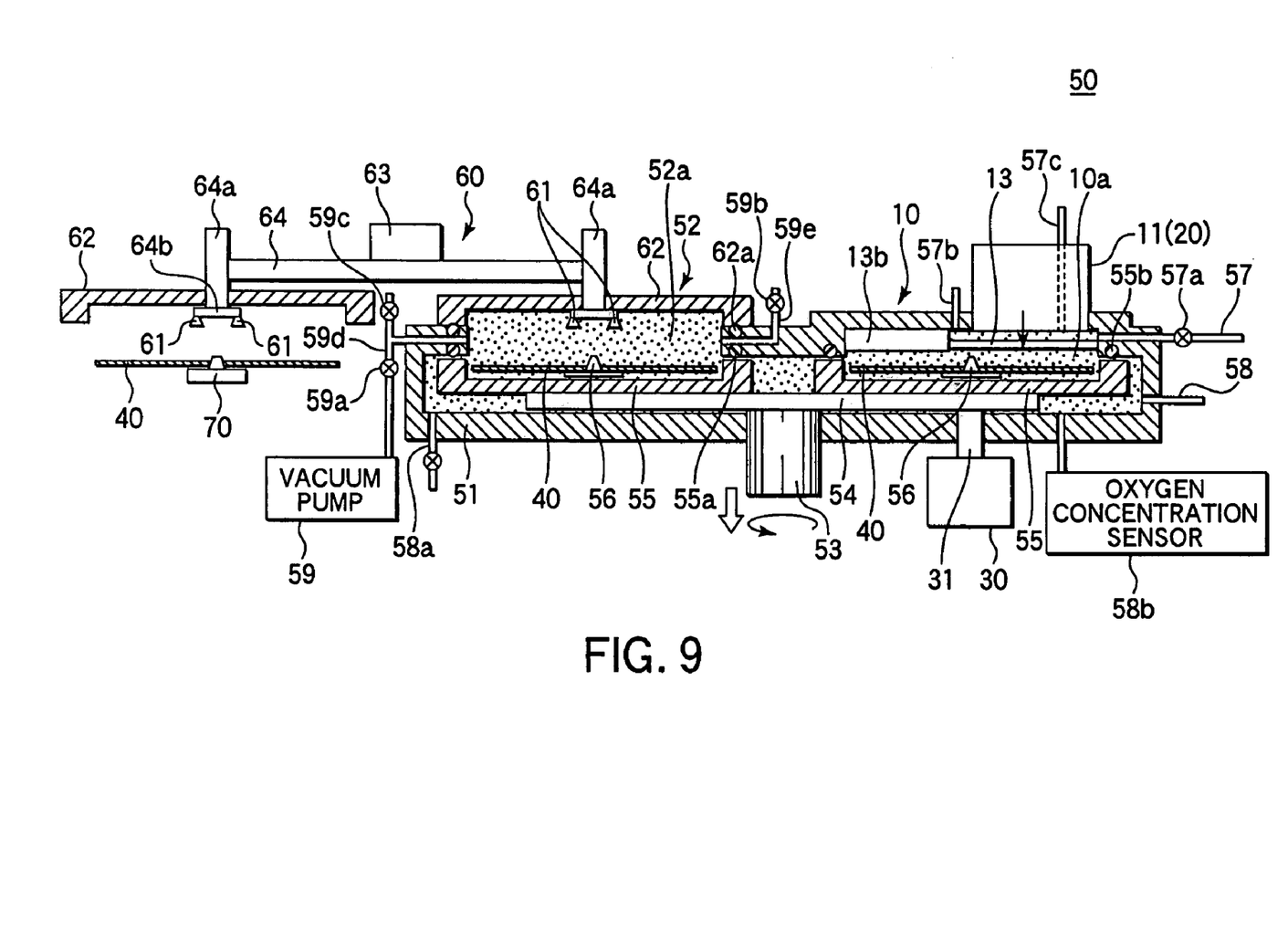

Thereafter, as shown in FIG. 9, the revolution shaft 53 supporting the inner transfer turn trays 55 is moved down, so that the close contact states of the inner transfer turn trays 55 are dissolved at the replacement room section 52 and electron beam irradiation section 10. Then, the revolution arm portion 54 is turned, so that the other inner transfer turn tray 55 supporting an irradiated irradiation target 40 is positioned at the replacement room section 52, and the inner transfer turn tray 55 that supports the replaced non-irradiated irradiation target 40 is positioned at the electron beam irradiation section 10.

At this time, the inner transfer turn tray 55 that supports the irradiated irradiation target 40 is positioned directly below the opening 52a, while the inner transfer turn tray 55 that supports the non-irradiated irradiation target 40 is positioned at the electron beam irradiation section 10. From this state, the revolution shaft 53 is moved up, so that the inner transfer turn trays 55 respectively come into close contact with the shielding seal portion 55a and shielding seal portion 55b. As a consequence, as shown in FIG. 1, the replacement room section 52 and the electron beam irradiation room 10a of the electron beam irradiation section 10 are formed in an airtightly closed state.

As described above, according to this embodiment, one of the inner transfer turn trays 55 disposed inside the chamber 51, and one of the outer transfer turn trays 62 of the irradiation target transfer device 60 disposed outside the chamber 51 constitute the replacement room section 52 having a load-lock function. With this arrangement, replacement of irradiation targets 40 can be performed, without damaging the inert gas atmosphere in the chamber 51, while preventing leakage of X-rays generated from the electron beam irradiation section 10. As a consequence, it is possible to reduce the amount of consumption of inert gas, which is used for maintaining the interior of the chamber 51 at a low oxygen concentration. Further, there is no need to separately prepare a special load-lock chamber or large-sized shield chamber made of lead, thereby allowing the apparatus to be compact.

The flow rate of an inert gas used for cooling the vacuum-tube type irradiation tubes 20 of the electron beam irradiation section 10 is controlled by feedback control in accordance with the temperature measurement result detected by the temperature sensor 57c at the radiation windows 25 of the vacuum-tube type irradiation tubes 20. As a consequence, the amount of consumption of inert gas is suppressed to a minimum amount required for this purpose, i.e., the amount of consumption is further reduced.

The position of the electron beam irradiation section 10 is set at one of the stop positions of the inner transfer turn trays 55, so that electron beam irradiation at the electron beam irradiation section 10 is performed on an irradiation target 40, in parallel with the replacement operation of irradiation targets 40. This arrangement makes it possible to shorten the cycle time including periods of time necessary for the replacement operation, electron beam irradiation, and turn-transfer of an irradiation target 40.

At the electron beam irradiation section 10, the shutter 13 can reliably control electron beam irradiation to be performed or not on an irradiation target 40. This allows the dose amount to be uniform among a plurality of irradiation targets 40.

In place of use of blocking by the shutter 13, the height of an irradiation target 40 relative to the vacuum-tube type irradiation tubes 20 may be adjusted at the electron beam irradiation section 10, in order to control electron beam irradiation to be performed or not on the irradiation target 40. Specifically, the range of electron beams emitted from the radiation windows 25 of the vacuum-tube type irradiation tubes 20 is only near the radiation windows 25. Accordingly, the height of an irradiation target 40 may be set to be out of the range, when the inner transfer turn tray 55 supporting it comes into close contact with the shielding seal portion 55b to form the electron beam irradiation room 10a. In this case, the height of the irradiation target 40 lifted for rotation is set such that the surface of the irradiation target 40 comes into the range of electron beams to undergo irradiation when the irradiation target 40 is lifted for rotation from the inner transfer turn tray 55 by the rotation drive shaft 31 through the irradiation target support 56.

According to this arrangement, for example, only the height of an irradiation target 40 at the electron beam irradiation room 10a is controlled, while the vacuum-tube type irradiation tubes 20 are continuously operated. As a consequence, it is possible to control electron beam irradiation to be performed or not on the irradiation target 40, without using a shield member, such as the shutter 13 or a mask described later. If a shield member, such as the shutter 13 or a mask described later, is used to control electron beam irradiation to be performed or not, while the vacuum-tube type irradiation tubes 20 are continuously operated, it is necessary to deal with the following matters. Specifically, in this case, the structure becomes complicate, and the shield member is irradiated with electron beams and generates heat during shielding, which necessitates a countermeasure for discharging heat. By contrast, where the height of an irradiation target 40 is controlled in relation to the electron beam range, such complicacy caused by use of the shield member can be avoided.

At the electron beam irradiation section 10, the vacuum-tube type irradiation tubes 20 are used which are arrayed in the radial direction of an irradiation target 40 rotated within the corresponding inner transfer turn tray 55. As illustrated in FIG. 5, the irradiation dose of the vacuum-tube type irradiation tubes 20 is set to be gradually higher as their positions are shifted from the central side to the peripheral side of the irradiation target 40. Therefore the imbalance in dose amount caused by the difference of the passage speeds of the central side and peripheral side of the irradiation target 40 relative to the electron beam 10 created during rotation is canceled, and the dose amount can be uniform all over the irradiation target 40.

Figure 10:
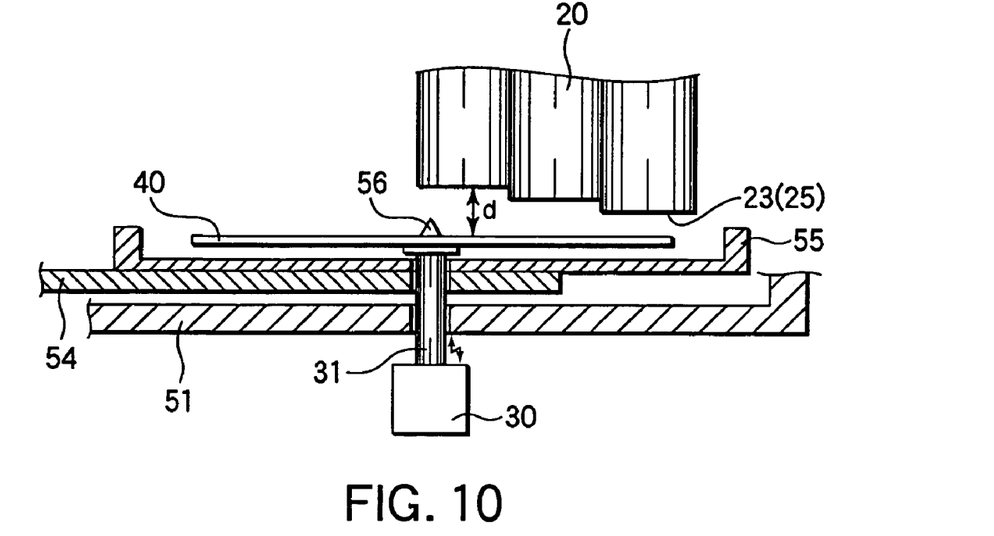
FIG. 10 is a sectional view showing another arrangement of vacuum-type irradiation tubes used in an electron beam irradiation apparatus according to an embodiment of the present invention.

An arrangement shown in FIG. 10 may be adopted to adjust the imbalance in dose amount caused by different passage speeds, relative to the electron beam irradiation section 10, among the respective portions of an irradiation target 40. Specifically, the intensity of an electron beam emitted from the radiation window 25 of a vacuum-tube type irradiation tube 20 is in reverse proportion to the distance d from the irradiation target 40. In view of this, the height of the respective vacuum-tube type irradiation tubes 20 from the inner transfer turn tray 55 is set to gradually reduce the distance d as their positions are shifted from the central side to the peripheral side of the irradiation target 40. In this case, the distance d is larger on the central side where the amount of electron beam irradiation needs to be smaller, while the distance d is smaller on the peripheral side.

With this arrangement, although the respective portions of an irradiation target 40 have different passage speeds relative to the electron beam irradiation section 10, the imbalance in dose amount caused by the passage speeds is offset, and the dose amount can be uniform all over the irradiation target 40.

As illustrated in FIG. 3 described above, the mask 12 is disposed between the shutter 13 and irradiation target 40, and has the opening 12a at a position corresponding to the array of the vacuum-tube type irradiation tubes 20. The opening 12a has an open width gradually increased from the central side to the peripheral side of the irradiation target 40 to adjust the irradiation amount from the central side to the peripheral side. In this case, when the irradiation target 40 is rotated at the electron beam irradiation section 10, the central side thereof having a smaller peripheral velocity is exposed to electron beams emitted from the vacuum-tube type irradiation tubes 20 for a shorter period of time, as compared to the peripheral side having a larger peripheral velocity. As a consequence, the electron beam dose amount can be uniform all over the irradiation target 40.

Figure 11:
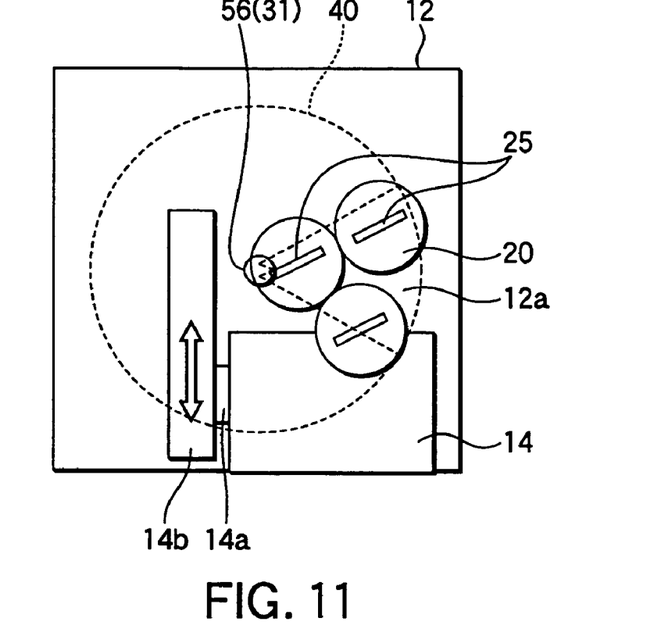
FIG. 11 is a bottom view showing another arrangement of a shutter mechanism used in an electron beam irradiation apparatus according to an embodiment of the present invention.
Figure 12:
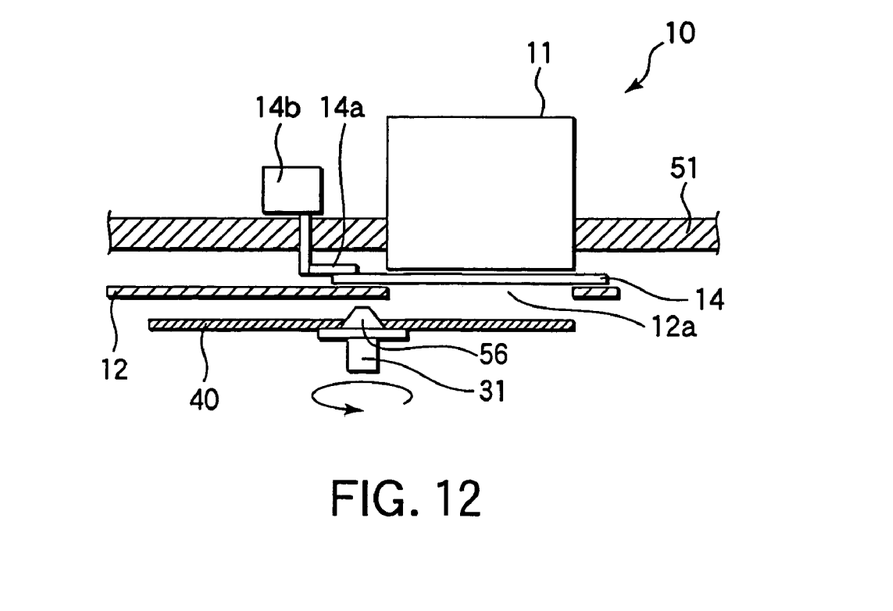
FIG. 12 is a sectional view showing said another arrangement of a shutter mechanism used in an electron beam irradiation apparatus according to an embodiment of the present invention.

FIGS. 11 and 12 show a modification of the shutter of the electron beam irradiation section 10. According to this modification, a shutter 14 is interposed between the mask 12 and the vacuum-tube type irradiation tubes 20 disposed within the shield box 11, and is supported by a shutter slide mechanism 14b through a shutter slide arm 14a. The shutter 14 is reciprocated by the shutter slide mechanism 14b between a position where it closes the opening 12a of the mask 12 to block electron beams from the vacuum-tube type irradiation tubes 20 toward an irradiation target 40, and a position where it opens the opening 12a to allow the irradiation target 40 to be irradiated with electron beams from the vacuum-tube type irradiation tubes 20.

The embodiments described above are intended only to clarify the technical content of the present invention, and thus the present invention should not be construed as being limited only to those specific examples. The embodiment described above may be modified and implemented in various ways within the spirit of the present invention and the scope of the claims.

For example, the embodiments described above employs vacuum-tube type irradiation tubes, as an example, but may employ a conventional drum type irradiation tube. Further, if an arrangement is adopted such that an acceleration voltage is applied to the electron beam irradiation section only when a ceiling plate and an irradiation target worktable engage with each other for electron beam irradiation, the peripheral devices thereof can be simplified. This arrangement, however, makes the cycle time longer, and thus should be adopted, depending on the purpose.

In the embodiments described above, the irradiation target is exemplified by a disk-like object, but it is not limited thereto. Further, electron beam irradiation may be utilized for sterilization other than cross-linking or curing of a resin.

It should be noted that the present invention includes various modifications made by suitably combining some of the components of the embodiments described above or removing a part of the components, as long as they do not depart from the scope of the present invention.

What is claimed is:

1. An electron beam irradiation apparatus comprising:
   a turn-transfer mechanism configured to transfer an irradiation target;
   a turn-transfer chamber in which the turn-transfer mechanism is disposed;
   an electron beam irradiation section disposed at a part of the turn-transfer chamber, and configured to irradiate the irradiation target with an electron beam while the irradiation target is rotated;
   a replacement room disposed at a part of the turn-transfer chamber, and configured to bring the irradiation target into and out of the turn-transfer chamber;
   an outer irradiation target holding table disposed outside the turn-transfer chamber, configured to form a part of the replacement room, and including an X-ray shielding mechanism, an airtightness maintaining mechanism, and an irradiation target holding mechanism;
   an inner irradiation target holding table disposed inside the turn-transfer chamber, configured to form a part of the replacement room, and including an X-ray shielding mechanism, an airtightness maintaining mechanism, and an irradiation target holding mechanism, the inner irradiation target holding table being supported by the turn-transfer mechanism;
   a turning mechanism configured to turn the turn-transfer mechanism and an elevator mechanism configured to move the turn-transfer mechanism up and down; and
   a rotation mechanism disposed at the electron beam irradiation section and configured to rotate the irradiation target.

2. The electron beam irradiation apparatus according to claim 1, further comprising additional one or more inner irradiation target holding tables arranged such that, when one of the inner irradiation target holding tables is positioned at the replacement room, at least another one of the inner irradiation target holding tables is positioned at an irradiation part of the electron beam irradiation section.

3. The electron beam irradiation apparatus according to claim 1, wherein, when the inner irradiation target holding table is positioned at the electron beam irradiation section by the turning mechanism of the turn-transfer mechanism and is brought into close contact with the electron beam irradiation section by the elevator mechanism, an electron beam irradiation room is formed and contains the irradiation target in an airtightly closed state, and wherein an X-ray shielding mechanism is disposed between the electron beam irradiation section and the inner irradiation target holding table to prevent X-rays from leaking out of the electron beam irradiation room.

4. The electron beam irradiation apparatus according to claim 1, further comprising a vacuum displacement mechanism configured to supply an inert gas into the replacement room after or while pressure-reducing the replacement room, which is kept airtight, so as to displace an interior of the replacement room with the inert gas.

5. The electron beam irradiation apparatus according to claim 1, wherein the electron beam irradiation section includes a plurality of vacuum-tube type irradiation tubes, and the electron beam irradiation apparatus is provided with a dose adjustment mechanism configured to attain a uniform absorption dose over the irradiation target, in accordance with peripheral velocities of the irradiation target, which is rotated by the rotation mechanism during irradiation.

6. The electron beam irradiation apparatus according to claim 5, wherein the dose adjustment mechanism has an adjustment function to adjust a tube current of each of the vacuum-tube type irradiation tubes, in accordance with peripheral velocities of the irradiation target rotated by the rotation mechanism.

7. The electron beam irradiation apparatus according to claim 5, wherein the dose adjustment mechanism has an adjustment function to adjust a distance between the inner irradiation target holding table and an irradiation window of the electron beam irradiation section, in accordance with peripheral velocities of the irradiation target rotated by the rotation mechanism.

8. The electron beam irradiation apparatus according to claim 5, wherein the dose adjustment mechanism comprises a mask, which is disposed between the irradiation window of the electron beam irradiation section and the irradiation target, and has an opening degree varying in accordance with peripheral velocities of the irradiation target rotated by the rotation mechanism.

9. The electron beam irradiation apparatus according to claim 1, wherein a moving distance of the elevator mechanism of the turn-transfer mechanism set to be larger than a range of an electron beam emitted from the irradiation window of the electron beam irradiation section.

10. The electron beam irradiation apparatus according to claim 1, further comprising a shutter member interposed between the irradiation window and the irradiation target and configured to block an electron beam emitted from the irradiation window, and a shutter drive mechanism configured to move the shutter member so as to control electron beam irradiation to be performed or not on the irradiation target from the irradiation window.

11. The electron beam irradiation apparatus according to claim 1, further comprising a first inert gas inlet and an inert gas outlet configured to supply an inert gas into the electron beam irradiation room.

12. The electron beam irradiation apparatus according to claim 1, further comprising a temperature sensor disposed near the irradiation window, and a temperature control mechanism configured to adjustment a flow rate of the inert gas supplied from the first inert gas inlet, in accordance with temperature measured by the temperature sensor, so as to control temperature of the irradiation window.

13. The electron beam irradiation apparatus according to claim 1, further comprising a second inert gas inlet configured to fill the turn-transfer chamber with an inert gas.

14. The electron beam irradiation apparatus according to claim 1, further comprising an oxygen concentration sensor disposed in the turn-transfer chamber, and an oxygen concentration control mechanism configured to adjust a flow rate of the inert gas supplied from a second inert gas inlet, in accordance with oxygen concentration measured by the oxygen concentration sensor, so as to adjust oxygen concentration in the turn-transfer chamber.

15. An electron beam irradiation method for irradiating an irradiation target with an electron beam under an inert gas atmosphere while rotating the irradiation target, using an electron beam irradiation apparatus, which comprises a turn-transfer mechanism configured to transfer an irradiation target; a turn-transfer chamber in which the turn-transfer mechanism is disposed; an electron beam irradiation section disposed at a part of the turn-transfer chamber, and configured to irradiate the irradiation target with an electron beam while the irradiation target is rotated; a replacement room disposed at a part of the turn-transfer chamber, and configured to bring the irradiation target into and out of the turn-transfer chamber; an outer irradiation target holding table disposed outside the turn-transfer chamber, configured to form a part of the replacement room, and including an X-ray shielding mechanism, an airtightness maintaining mechanism, and an irradiation target holding mechanism; an inner irradiation target holding table disposed inside the turn-transfer chamber, configured to form a part of the replacement room, and including an X-ray shielding mechanism, an airtightness maintaining mechanism, and an irradiation target holding mechanism, the inner irradiation target holding table being supported by the turn-transfer mechanism; and a rotation mechanism disposed at the electron beam irradiation section and configured to rotate the irradiation target, the method comprising:

transferring the irradiation target into and out of the turn-transfer chamber in a replacement room formed by the inner irradiation target holding table and the outer irradiation target holding table, which respectively form parts of the replacement room;

turn-transferring the inner irradiation target holding table, which supports the irradiation target, to the electron beam irradiation section, within the turn-transfer chamber; and irradiating the irradiation target with an electron beam while rotating the irradiation target by the rotation mechanism, within the inner irradiation target holding table.

16. The electron beam irradiation method according to claim 15, wherein additional one or more inner irradiation target holding tables are disposed inside the turn-transfer chamber such that, when one of the inner irradiation target holding tables is positioned at the replacement room to replace an irradiation target, at least another one of inner irradiation target holding tables is positioned at the electron beam irradiation section and an irradiation target mounted thereon is irradiated with an electron beam while being rotated by the rotation mechanism.

17. The electron beam irradiation method according to claim 15, wherein the inner irradiation target holding table is configured to be turned in a transfer direction and moved up and down within the turn-transfer chamber, and to form the replacement room and an electron beam irradiation room by movement upward at positions corresponding to the replacement room and the electron beam irradiation section, respectively, and wherein the inner irradiation target holding table, which supports the irradiation target, is moved down at the position corresponding to the replacement room, then turn-transferred to the electron beam irradiation section, and then moved up at the electron beam irradiation section, to form the electron beam irradiation room with an X-ray shield, in which the irradiation target is irradiated with an electron beam while being rotated.

18. The electron beam irradiation method according to claim 15, wherein an inert gas is supplied into the replacement room after or while pressure-reducing the replacement room, so as to displace an interior of the replacement room with the inert gas.

19. The electron beam irradiation method according to claim 15, wherein the electron beam irradiation section includes a plurality of vacuum-tube type irradiation tubes, which irradiate the irradiation target with electron beams while the irradiation target is rotated, with an electron beam irradiation amount adjusted in accordance with peripheral velocities of the irradiation target during rotation.

20. The electron beam irradiation method according to claim 19, wherein a tube current of each of the vacuum-tube type irradiation tubes is individually adjusted, in accordance with peripheral velocities of the irradiation target during rotation.

21. The electron beam irradiation method according to claim 19, a distance between the irradiation target being rotated and an irradiation window of each of the vacuum-tube type irradiation tubes is adjusted, in accordance with peripheral velocities of the irradiation target.

22. The electron beam irradiation method according to claim 19, wherein, between an irradiation window of the electron beam irradiation section and the irradiation target, a mask is disposed to have an opening degree varying in accordance with peripheral velocities of the irradiation target during rotation, so as to adjust an absorption dose over the irradiation target.

23. The electron beam irradiation method according to claim 15, wherein the irradiation target is moved up and down between a height to be within a range of an electron beam emitted from the irradiation window at the electron beam irradiation section and a height to be out of the range, so as to control electron beam irradiation to be performed or not.

24. The electron beam irradiation method according to claim 15, wherein a shutter member is interposed between the irradiation window and the irradiation target and configured to block an electron beam emitted from the irradiation window onto the irradiation target, and the shutter member is switched for the electron beam to be transmitted or blocked, so as to control an irradiation dose of the electron beam onto the irradiation target.

25. The electron beam irradiation method according to claim 15, wherein the turn-transfer chamber is filled with an inert gas to reduce residual oxygen concentration, when the irradiation target is irradiated with an electron beam.

26. The electron beam irradiation method according to claim 15, wherein a flow rate of the inert gas is adjusted, in accordance with oxygen concentration measured by an oxygen concentration sensor disposed in the turn-transfer chamber, so as to control oxygen concentration in the turn-transfer chamber.

27. The electron beam irradiation method according to claim 15, wherein a flow rate of an inert gas supplied near the irradiation window of the electron beam irradiation section is adjusted, in accordance with temperature measured by a temperature sensor disposed near the irradiation window, so as to control temperature of the irradiation window.

\* \* \* \* \*